United States Patent [19]

Koukkari et al.

[11] Patent Number: 5,757,247
[45] Date of Patent: May 26, 1998

[54] DEVICE AND METHOD FOR TUNING A BAND-PASS FILTER UTILIZING MIXING RESULTS WITH DC COMPONENT REMOVED

[75] Inventors: Eero Koukkari; Pekka Heikkilä, both of Oulu, Finland

[73] Assignee: Nokia Telecommunications Oy

[21] Appl. No.: 481,262

[22] PCT Filed: Dec. 29, 1993

[86] PCT No.: PCT/FI93/00566

§ 371 Date: Nov. 13, 1995

§ 102(e) Date: Nov. 13, 1995

[87] PCT Pub. No.: WO94/16496

PCT Pub. Date: Jul. 21, 1994

[30] Foreign Application Priority Data

Dec. 30, 1992 [FI] Finland ................... 925955

[51] Int. Cl.[6] ................... H03H 7/01
[52] U.S. Cl. ........... 333/17.1; 455/123; 455/125; 333/174
[58] Field of Search ................... 333/17.1, 174; 455/120, 123, 125

[56] References Cited

U.S. PATENT DOCUMENTS

| | | | |
|---|---|---|---|
| 5,235,294 | 8/1993 | Ishikawa et al. | 333/17.1 |
| 5,420,552 | 5/1995 | Särkkä | 333/17.1 |
| 5,525,940 | 6/1996 | Heikkilä et al. | 333/17.1 |

FOREIGN PATENT DOCUMENTS

| | | | |
|---|---|---|---|
| 0494058 | 7/1992 | European Pat. Off. | 333/17.1 |
| 2923277 | 12/1980 | Germany . | |
| 9220149 | 11/1992 | WIPO | 333/17.1 |

Primary Examiner—Robert Pascal
Assistant Examiner—Barbara Summons
Attorney, Agent, or Firm—Pillsbury Madison & Sutro LLP

[57] ABSTRACT

A device and a method for adjusting a bandpass filter, especially a combiner filter. The method includes deriving an RF sample signal proportional to the power of a modulated RF signal which is one of: passing forward to the bandpass filter, reflected from the input of the bandpass filter and passed through the bandpass filter; down-converting the sample signal by another RF signal; detecting the signal strength of the mixing result; adjusting the center frequency of the passband of the bandpass filter on the basis of the detected signal strength. There is an essential frequency or modulation difference between the signals to be mixed, and so the mixing result is an AC signal of a lower frequency. No accurate adjustment of the phase relation of the signals to be mixed is required. Preferably, the frequency or phase difference between the signals to be mixed is accomplished by utilizing the phase modulation contained in the transmission when one of the signals is unmodulated. The DC component is filtered off the AC signal, which eliminates the measuring problems that otherwise would be caused by the DC offset properties of the mixer.

12 Claims, 4 Drawing Sheets

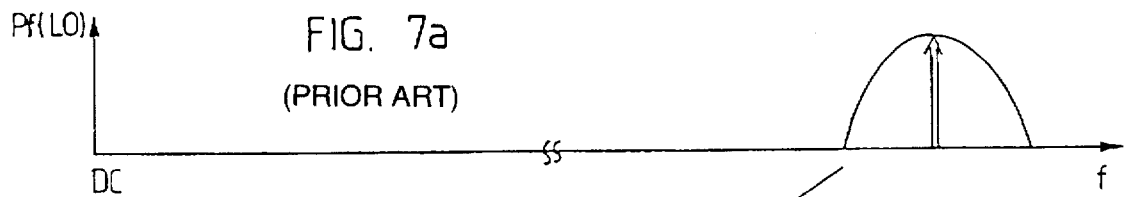
FIG. 7a
(PRIOR ART)
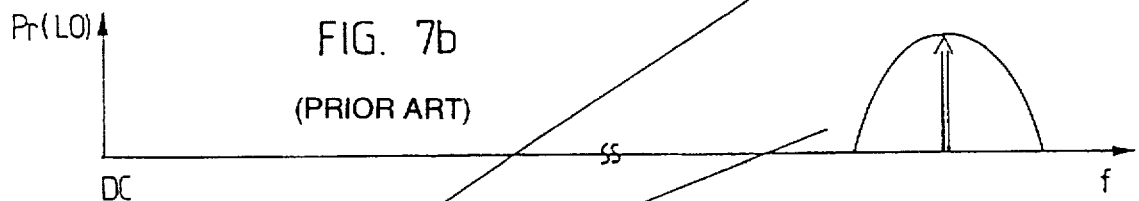
FIG. 7b
(PRIOR ART)
FIG. 7c
(PRIOR ART)
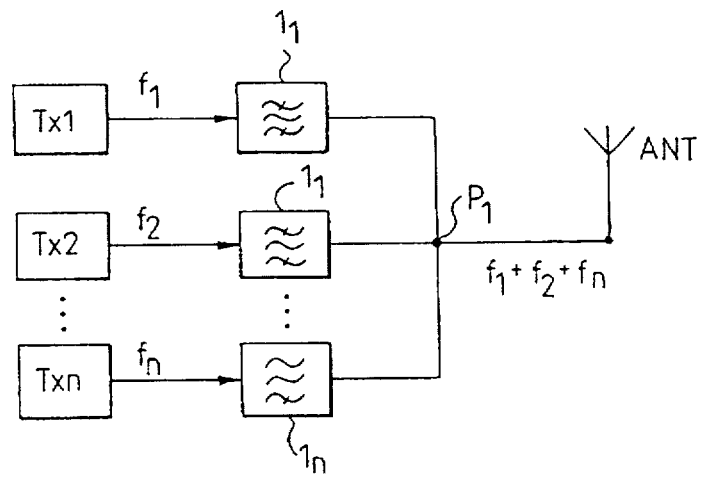
FIG. 1

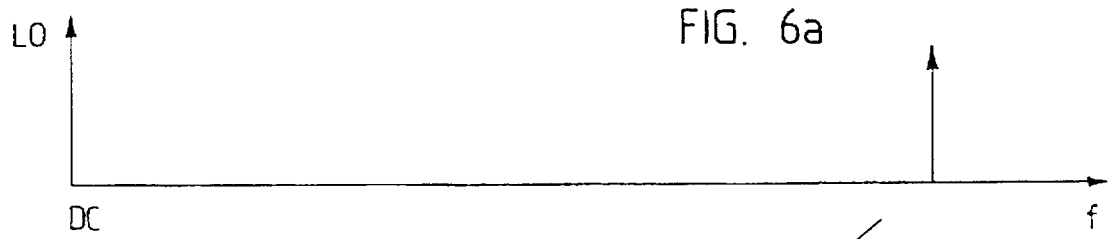
FIG. 6a
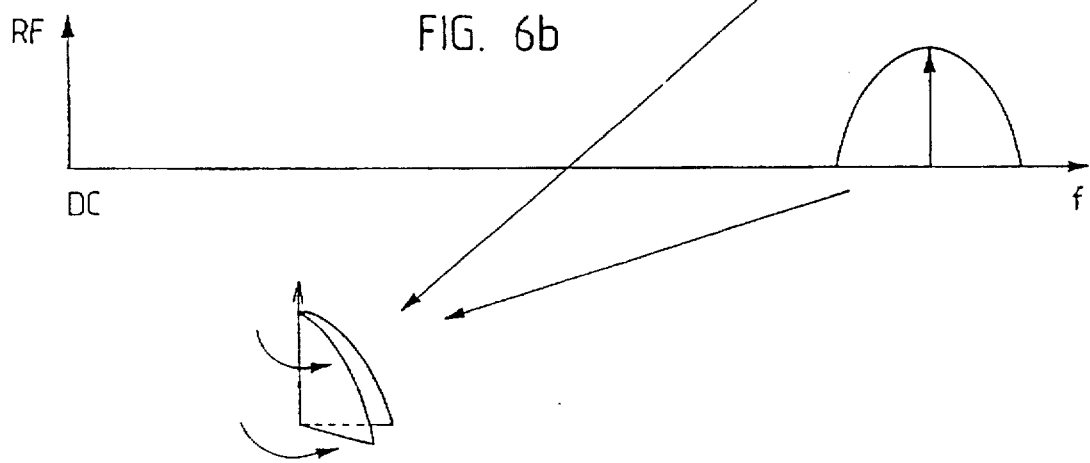
FIG. 6b
FIG. 6c
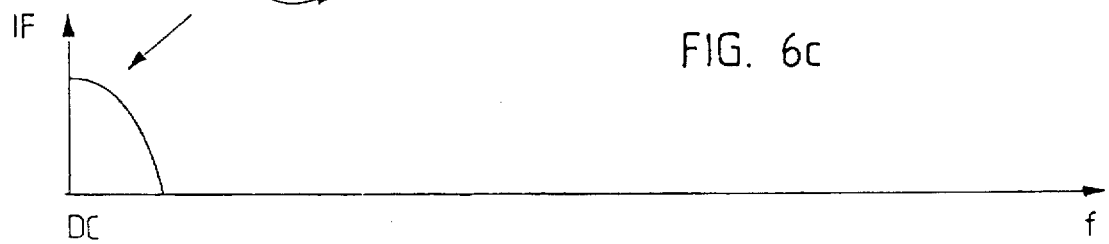
FIG. 6d
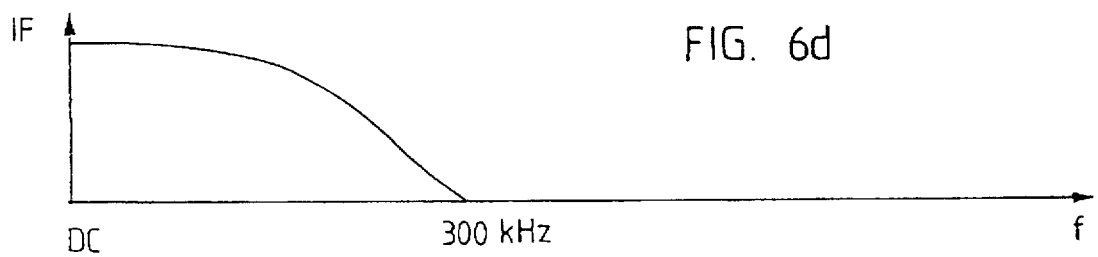
FIG. 6e
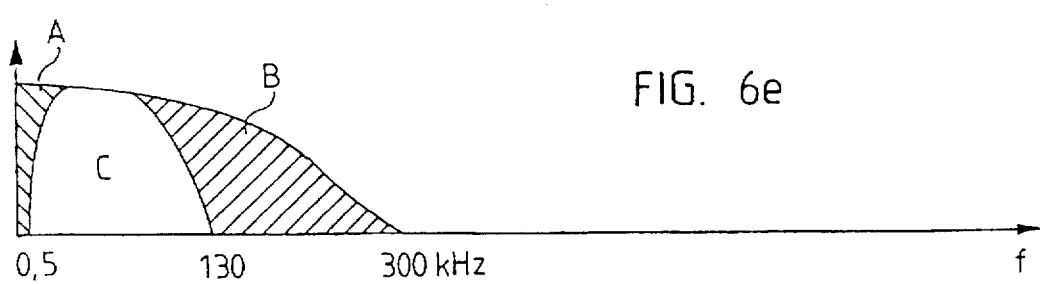

DEVICE AND METHOD FOR TUNING A BAND-PASS FILTER UTILIZING MIXING RESULTS WITH DC COMPONENT REMOVED

This Application is a 371 of International Application No. PCT/FI93/00566, filed Dec. 29, 1993.

BACKGROUND OF THE INVENTION

The invention relates to a method for adjusting the frequency of an RF bandpass filter, especially a combiner filter, comprising deriving an RF sample signal proportional to the power of a modulated RF signal passing forward to the bandpass filter, reflected from the input of the bandpass filter or passed through the bandpass filter; down-converting the sample signal by another RF signal; detecting the signal strength of the mixing result; adjusting the centre frequency of the passband of the bandpass filter on the basis of the detected signal strength.

One known way to connect several radio transmitters to tho same antenna or antenna line is to connect each radio transmitter through a separate bandpass filter having its centre frequency tuned to the transmitting frequency of the radio transmitter. Such bandpass filters are called combiner filters. The function of the combiner filter is to feed the transmitting signal of the respective radio transmitter to the antenna with the smallest possible losses and prevent the leakage of transmitting signals of different frequencies from other radio transmitters, from the direction of the antenna, to this particular radio transmitter as efficiently as possible. Conventionally, combiner bandpass filters are tuned fixedly to the transmitting frequencies of the radio transmitters. So it has not been possible to change the transmitting frequency of the radio transmitter without simultaneously changing the combiner filter or its tuning.

In certain cases, however, it is desirable that the frequencies of radio transmitters can be changed simply and rapidly. One such case is the base station of a cellular mobile radio system to which pre-determined transmitting and receiving channels have been assigned. In cases where the channel allocation of the system can be altered, if desired, by varying the transmitting and receiving frequencies of the base stations, the channel capacity of the system can be utilized in a flexible and efficient way in varying conditions. Therefore combiner filters have been developed in which the centre frequency changes automatically with the transmitting frequency.

The adjustment of known automatically tunable combiner filters is based on measuring RF power reflected from the input of the filter or RF power passing through the combiner filter, and on locking to a minimum/maximum value of the measured power. Two problem with this adjustment method are, however, the low adjusting accuracy and the narrow dynamic range. As the frequency selectivity of the entire adjusting system relies on the combiner filter, power components of other radio transmitters leaking through the combiner filter to its input cause the minimum reflection suppression value of the reflection suppression measurement at the filter input to be about 7 dB, which results in a narrow dynamic range for the measurement. In the adjustment method based on the measurement of the power passing through the combiner filter, the measuring dynamics of the maximum power value also remain low for the same reasons as have been given above. In addition, the automatically tunable combiner filter based on this prior art adjustment method does not allow variation in the relative power levels between the radio transmitters, that is, the "mutual dynamics" value is almost 0 dB, as a change in the power level of one transmitter affects immediately the power measurement in the adjustment circuits of the combiner filters of the other radio transmitters, thus causing adjustment error.

Finnish Patent Application 912 255 (which corresponds to Sarkka U.S. Pat. No. 5,420,552, issued May 30, 1995) discloses an adjusting arrangement for a combiner bandpass filter where the adjusting accuracy and dynamic range have been improved by frequency-selective power measurement. Referring to FIG. 7, the prior art measurement is based on mixing a transmission $P_f$ passing forward to a combiner filter (FIG. 7a) and a similarly modulated transmission (FIG. 7b) reflected $P_r$ from the combiner filter or passed through it. The DC signal thus obtained as a mixing result (FIG. 7c) is lowpass-filtered, and the obtained signal is used for calculating the tuning state of the combiner filter. This prior art measuring principle has the following properties:

- signals applied to the mixer are identical in modulation, wherefore the measuring signal obtained from the mixer is a DC signal if the transmission is a signal with a constant amplitude;
- the phase difference between the signals at the mixer inputs affects essentially the output signal of the mixer, wherefore the phases of the input signals have to be adjusted suitably in order to achieve the desired operation;
- to eliminate the DC offset errors of the mixer, adjustable amplifiers have to be provided in the input branches of the mixer so as to optimize the signal levels of the mixer.

On account of these properties, the prior art measuring arrangement requires a device the production process of which comprises tuning and measuring steps for eliminating any inaccuracies due to phase difference, for instance, from the final product.

SUMMARY OF THE INVENTION

The object of the present invention is to simplify the structure of the device used in frequency-selective measurement and to eliminate the above-mentioned steps from the production process of the device.

This is achieved by a method of the type described in the foregoing BACKGROUND section, which according to the invention is characterized in that the down-conversion of the sample signal comprises mixing the sample signal with an RF signal having a substantially different frequency and being unmodulated or differing in modulation in such a manner that the signal obtained as a mixing result is an AC signal of a lower frequency; ant that the DC component is removed through filtration from the AC signal before detection.

The invention also relates to a device for adjusting an RF bandpass filter, especially a combiner filter, comprising means for deriving an RF sample signal proportional to the RF power of a modulated signal passing forward to the bandpass filter, reflected from the input of the bandpass filter, or passed through the bandpass filter; mixing means for down-converting the sample signal; detecting means for detecting the strength of the down-converted sample signal; a control means for adjusting the centre frequency of the bandpass filter in response to the detection result. The device according to the invention is characterized in that the mixing means mixes the sample with an RF signal having a substantially different frequency and being unmodulated or differing in modulation in a manner such that the signal

3 obtained as a mixing result is an AC signal having a lower frequency, and that the device further comprises filter means for removing the DC component from the AC signal before the detection means.

In the present invention there is a substantial frequency or modulation difference between the signals to be mixed, and so the mixing result will be an AC signal having a lower frequency. No accurate adjustment of the phase relation between the signals to be mixed is needed. In the preferred embodiment of the invention, the frequency or phase difference between the signals to be mixed is accomplished by utilizing the phase modulation present in the transmission when one of the signals is unmodulated. The DC component is filtered off the AC signal, which eliminates any measuring problems caused by the DC offset properties of the mixer. The adjustable amplifiers used in the prior art device can be omitted.

BRIEF DESCRIPTION OF THE DRAWINGS

In the following section of this specification the invention will be described by means of illustrating embodiments with reference to is the attached drawings, in which FIG. 1 is a block diagram Illustrating a typical transmitter arrangement implemented by combiner filters;

FIGS. 6a–6e illustrate the selective measuring according to the invention in the frequency domain;

FIGS. 7a, 7b, and 7c illustrate the prior art frequency-selective measuring.

DETAILED DESCRIPTION

Referring to FIG. 1, n radio transmitters Tx1 ... Txn having transmitting frequencies $f_1 ... f_n$ respectively, are connected through bandpass filters $1_1, 1_2, ... 1_n$ tuned to the respective frequencies to a common summing point P1 and further through an antenna line to a common transmitting antenna ANT. Therefore, a radio-frequency (RF) signal applied to the transmitting antenna ANT comprises the frequencies $f_1 ... f_n$ of all the transmitters. The transmitting frequencies $f_1 ... f_n$ are within the range 920–960 MHz, for instance. Such bandpass filters connecting several transmitters to a common antenna are generally referred to as combiner filters. The invention will be described below in connection with combiner filters, in which it can be particularly advantageously applied, but the invention can also be applied in filters intended for other purposes when frequency-selective power measurement is required in the frequency adjustment.

Figure 2:
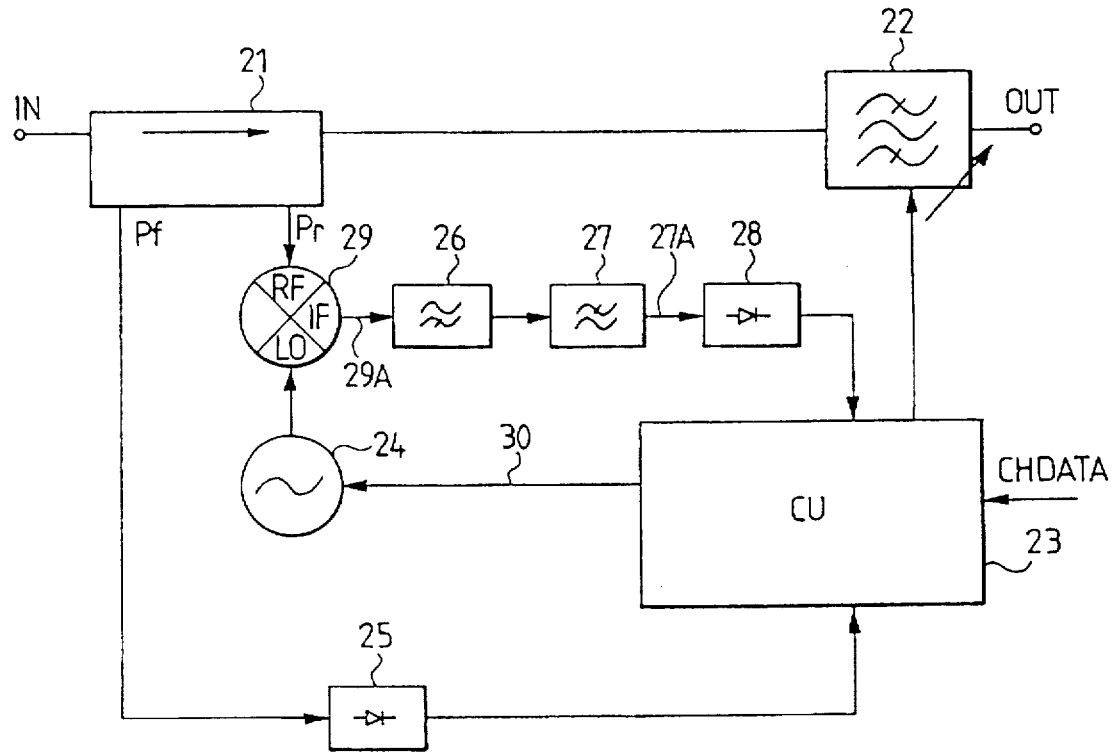
FIG. 2 is a block diagram of a switching arrangement according to the invention for adjusting a bandpass filter, wherein power reflected from the input of the filter is measured.

FIG. 2 illustrating a combiner filter utilizing the measurement of reflected power is now referred to. A frequency- or phase-modulated, transmitting-frequency RF signal, shown in the frequency domain In FIG. 6b, has been applied from a radio transmitter to an input IN, and is fed via a directional coupler means 21 or the like to a bandpass filter 22 and further to an output OUT in the bandpass filter, which output may be connected, e.g., to an antenna summing point P1 of the type shown in FIG. 1. The bandpass filter 22 is a narrowband filter the centre frequency of which should be adjusted as close as possible to the frequency of the transmitting carrier of the radio transmitter so that a signal to be transmitted will propagate to the antenna ANT with losses as small as possible. The centre frequency of the bandpass filter 22 is adjusted on the basis of the power of the radio frequency signal component reflected from the input of the bandpass filter 22 so that the reflected power component will be minimized. For this purpose the directional coupler means 21 derives from the signal components reflected back from the input of the bandpass filter 22 a sample signal Pr proportional to the power of the signal component, and the sample is applied to the input of a mixer 29. In the preferred embodiment of the invention, a local oscillator 24 (also referred to as a generator) generates an unmodulated local oscillator signal LO, which is applied to a local oscillator input LO in the mixer 29. Due to modulation, there is a phase difference between the signals Pr and LO according to the invention, so that a low-frequency (zero-intermediate-frequency) AC signal 29A is obtained as a mixing result in a mixer output IF: the spectral components which are caused by the channel to be measured in the AC signal are preferably at frequencies below 150 kHz, and the level of the signal is proportional to the RF signal reflected from the combiner filter 22. In the preferred embodiment of the invention, the frequency of the generator 24 is the centre frequency of the modulated RF signal from the transmitter, as illustrated in the frequency domain in FIG. 6a. There is thus a substantial frequency difference corresponding with the frequency modulation of the RF signal between the input signals RF and LO of the mixer 29, and the output IF exhibits as a mixing result the AC signal 29A corresponding with the modulation contained in the RF signal, as shown in FIG. 6c (the modulation below the centre frequency is folded within a range above the DC level). FIG. 6d shows the spectrum of FIG. 6c on an enlarged scale.

Alternatively, the signal LO may also be modulated, containing, however, a different modulation than the sample signal. The signals LO and RF may also have frequencies fully different from each other, in which case the mixing result will be obtained somewhere else than in the vicinity of the zero-intermediate frequency AC signal 29A.

A control unit 23 controls the local oscillator 24 by means of a control signal 30. The control unit 23, in turn, obtains information about the current transmission channel in the form of a signal CHDATA from the same controller that feeds the channel data to the radio transmitter itself. Upon receiving new channel data, the control unit 23 controls the local oscillator 24 by the control signal 30 to a transmitting frequency corresponding to the new channel.

A highpass filter 26 (threshold frequency e.g. 0.5 kHz), provided after the mixer 29 separates the DC component from the AC signal, which is represented by area A in FIG. 6a. A lowpass filter 27 (threshold frequency e.g. 130 kHz) filters off radio-frequency components (area B in FIG. 6e) and spectral components leaked from other transmitters at low frequencies over 500 kHz. A filtered AC signal 27A (having a frequency spectrum represented by area C in FIG. 6a) is detected by a rectifier 28, and the detection result is applied to the control unit 23, where is it A/D converted. The detector 28 is preferably a two-sided peak value rectifier.

Two-sided peak value rectification is needed as the preceding lowpass filter 27 causes fluctuation in the signal amplitude, which would cause measuring problems after rectification. In a TDMA type transmission, the transmitter power may vary rapidly from one time slot to another (each time slot is e.g. 577 μs in duration), so that the peak value rectification also allows tho measuring dynamics to be broadened. For example, when the transmitter employs a single time slot, the measuring dynamics will be improved by about 18 dB when a slow A/D conversion is applied in the measurement taking place in the control block 23.

The filter responses of the low- and highpass filters 26 and 27 are preferably such that they weight the spectrum of a down-converted sample signal in a manner such that the effect of signal components at the centre frequencies of the transmitter channel will be emphasized in the measurement. In this way, the tendency of the mixing and measuring method to tune the combiner filter in accordance with the spectral distribution of the transmitter signal is prevented, and a good tuning accuracy is ensured.

The directional coupler 21 derives a sample signal Pf from forward RF power, and the sample signal is detected directly by a diode detector 25 and applied to the control unit 23. The control unit 23 tends to adjust the centre frequency of the bandpass filter 22 so that the reflection coefficient calculated from the detection results, i.e. the ratio of the reflected power to the forward power, will be minimized. However, when direct detection is applied to the forward power Pf, the signal to be measured is a radio-frequency signal, which is difficult to process as compared with a sample derived from the detection branch of the reflected power Pr. When the above-mentioned reflection coefficient is used as an adjusting criterion, it would, however, be more advantageous to apply a similar signal processing to both of the sample signals Pr and Pf.

Figure 3:
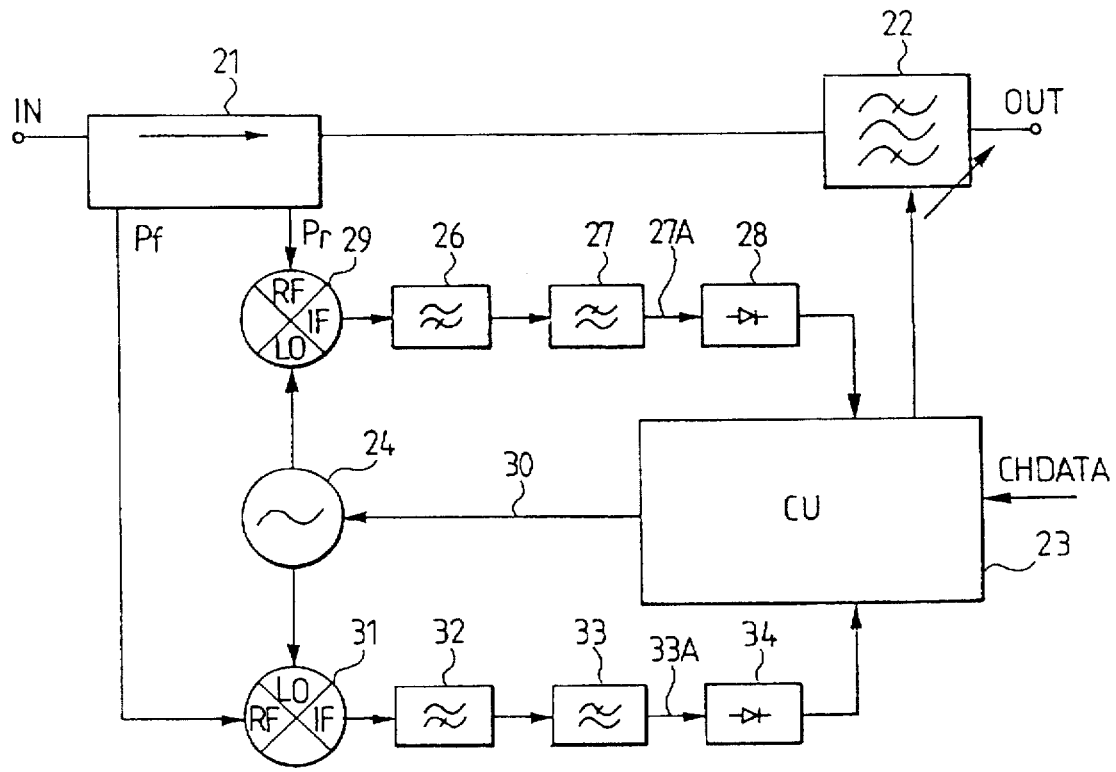
FIG. 3 is a block diagram of a switching arrangement according to the invention for adjusting a bandpass filter, wherein forward power and reflected power are measured.

FIG. 3 shows a switching arrangement in which the same reference numerals and symbols indicate the same components or functions as in FIG. 2. As distinct from FIG. 2, however, the signal processing of the sample signal Pf of the forward power comprises, in place of the diode detector 25, a mixer 31, a highpass filter 32, a lowpass filter 33, and a rectifier detector 34, which correspond in structure and operation with the respective elements 29, 26, 27 and 28 of the Pr branch. Signal LO from the generator 24 is also applied to the local oscillator input LO of the mixer 31. An advantage of the structure shown in FIG. 3 is that the Pr and Pf measuring branches are symmetrical, and so, for instance, the temperature behaviour of each measuring branch is similar.

Figure 4:
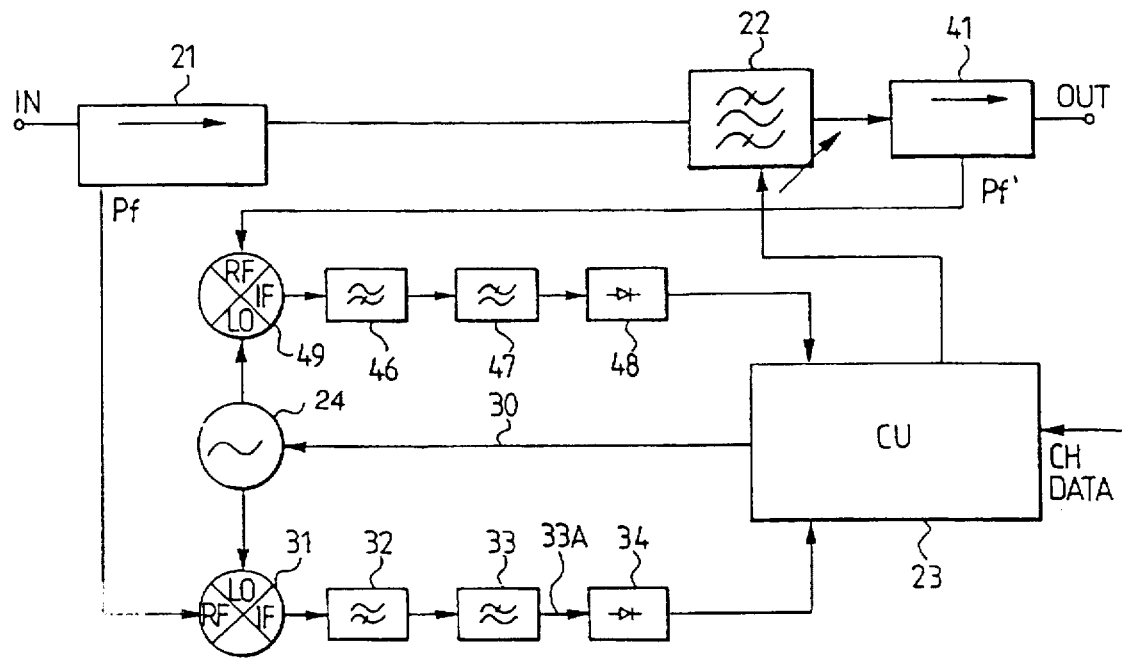
FIG. 4 is a block diagram of a switching arrangement according to the invention for adjusting a bandpass filter, wherein forward power and power passed through are measured.

FIG. 4 shows a structure where the Pr measuring branch has been omitted; instead, the measurement of the power passing through the combiner filter 22 is utilized. The same reference numerals and symbols indicate the same components or functions as in FIGS. 2 and 3. Another directional coupler 41, or the like, is connected to the output of the bandpass filter 22, which directional coupler derives a sample signal Pf' from the output signal of the bandpass filter; the sample signal Pf' is applied to a measuring branch formed by a mixer 49, a highpass filter 46, a lowpass filter 47 and a rectifier detector 48. In structure and signal processing, the Pf' measuring branch corresponds fully with the Pr measuring branch shown in FIG. 2. The frequency of the generator 24 is applied to tho local oscillator input LO of the mixer 49. The detection result from the detector 48 is applied to the control unit 23, which adjusts the centre frequency of the filter in such a manner that the ratio of the power Pf' passed through to the forward power Pf will be maximized.

Figure 5:
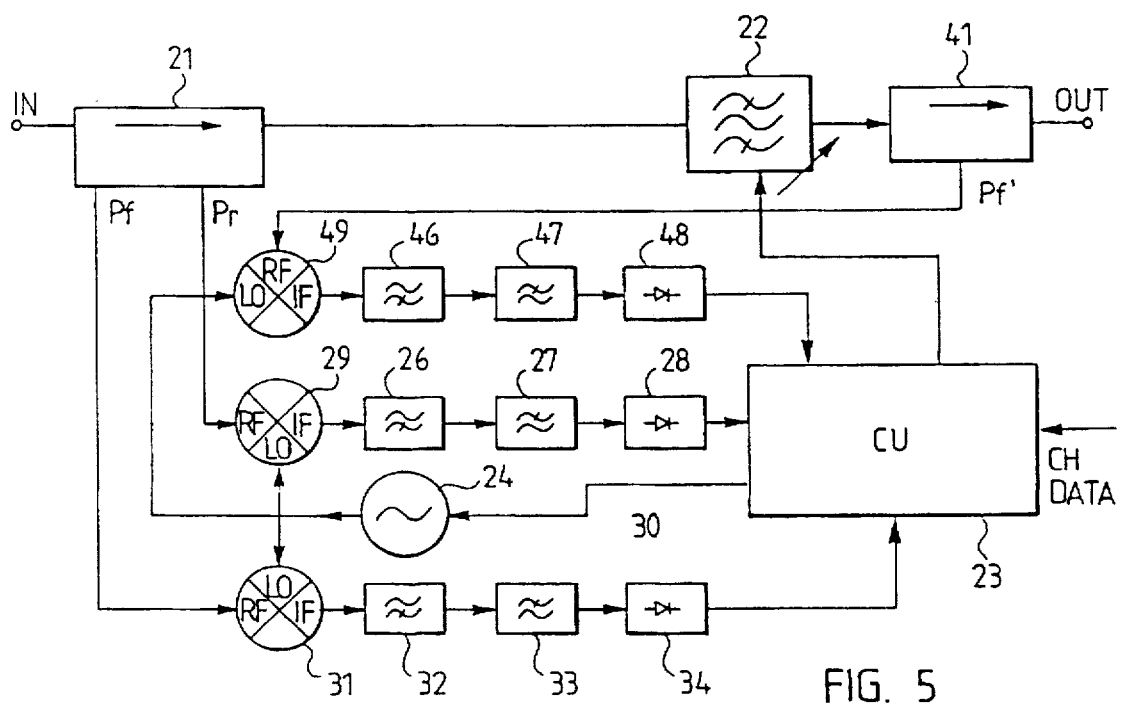
FIG. 5 is a block diagram of a switching arrangement according to the invention for adjusting a bandpass filter, wherein forward power, reflected power and power passed through are measured.

FIG. 5 shows still another switching arrangement for adjusting the frequency of a bandpass filter, where the measuring of the forward power Pf, the reflected power Pr, and the power Pf' passed through is utilized. The switching arrangement of FIG. 5 is thus a combination of the switching arrangements of FIGS. 3 and 4. The control unit 23 adjusts the filter 22 so that the power ratios Pr/Pf and Pf'/Pf will be at desired values.

The figures and the description related to them are only intended to illustrate the present invention. In their details the method and device according to the invention may vary within the scope of the attached claims.

We claim:

1. A method for adjusting an RF bandpass filter, comprising the steps of:
    (a) deriving an RF sample signal proportional to the power of a modulated RF signal which is one of:
        (i) passing forward to the bandpass filter,
        (ii) reflected from the input of the bandpass filter, and
        (iii) passed through the bandpass filter;
    (b) down-converting the sample signal by another RF signal by:
        (i) mixing the sample signal with said another RF signal having a substantially different frequency from said sample signal, and said another RF signal being one of:
            unmodulated, and
            differing in modulation, such that the signal obtained is an AC signal of lower frequency, having a DC component; and
        (ii) removing the DC component from said signal obtained, to provide a mixing result;
    (c) detecting the signal strength of said mixing result; and
    (d) adjusting the centre frequency of the bandpass filter on the basis of the signal strength detected in step (c).

2. The method of claim 1, wherein:
said another RF signal of step (b) has a frequency which differs from that of said sample signal at least in an amount corresponding to the frequency modulation of said sample signal.

3. The method of claim 1, wherein:
said sample signal derived in step (a) is proportional to the power of a modulated RF signal which is reflected from the input of the bandpass filter; and
step (d) comprises adjusting the bandpass filter so as to minimize the value of said mixing result.

4. The method of claim 1, wherein:
said sample signal derived in step (a) is proportional to the power of a modulated RF signal which is passed through said bandpass filter; and
step (d) comprises adjusting the bandpass filter so as to minimize the value of said mixing result.

5. A method for adjusting an RF bandpass filter, comprising the steps of:
    (a) deriving a first RF sample signal proportional to the power of a modulated RF signal which is reflected from the input of the bandpass filter;
    (b) deriving a second RF sample signal proportional to the power of said modulated RF signal as passing forward to said bandpass filter;
    (c) down-converting said first and second sample signals by a same other RF signal by:
        (i) mixing each respective sample signal with said other RF signal having a substantially different frequency from each respective said sample signal, and said other RF signal being one of:

unmodulated, and
differing in modulation, such that each respective signal obtained is an AC signal of lower frequency, having a DC component; and
(ii) removing the DC component from each respective signal obtained, to provide a respective mixing result;
(d) detecting the signal strength of each said mixing result;
(e) calculating a reflection coefficient from the signal strengths detected in step (d); and
(f) adjusting the centre frequency of said bandpass filter on the basis of said reflection coefficient.

6. A method for adjusting an RF bandpass filter, comprising the steps of:
(a) deriving a first RF sample signal proportional to the power of a modulated RF signal which is reflected from the input of the bandpass filter;
(b) deriving a second RF sample signal proportional to the power of said modulated RF signal as passing forward to said bandpass filter;
(c) deriving a third RF sample signal proportional to the power of said modulated RF signal as passed through said bandpass filter;
(d) down-converting said first, second and third sample signals by a same other RF signal by:
(i) mixing each respective sample signal with an said other RF signal having a substantially different frequency from each respective said sample signal, and said other RF signal being one of:
unmodulated, and
differing in modulation, such that each respective signal obtained is an AC signal of lower frequency, having a DC component; and
(ii) removing the DC component from each respective signal obtained, to provide respective first, second and third mixing results;
(e) detecting the signal strength of each said mixing result;
(f) calculating two power ratios, respectively of said first and second mixing results and said third and second mixing results; and
(g) adjusting the centre frequency of said bandpass filter so as to maintain said ratios within desired ranges of values.

7. A device for adjusting an RF bandpass filter, comprising:
(a) deriving means for deriving an RF sample signal proportional to the power of a modulated RF signal which is one of:
(i) passing forward to the bandpass filter,
(ii) reflected from the input of the bandpass filter, and
(iii) passed through the bandpass filter;
(b) mixing means for down-converting the sample signal by another RF signal by:
(i) mixing the sample signal with said another RF signal having a substantially different frequency from said sample signal, and said another RF signal being one of:
unmodulated, and
differing in modulation, such that the signal obtained is an AC signal of lower frequency, having a DC component; and
(ii) removing the DC component from said signal obtained, to provide a mixing result;

(c) detecting means for detecting the signal strength of said mixing result; and
(d) control means for adjusting the centre frequency of the bandpass filter on the basis of the signal strength detected by said detecting means.

8. The device of claim 7, wherein:
said another RF signal as input for mixing by said mixing means has a frequency which differs from that of said sample signal at least in an amount corresponding to the frequency modulation of said sample signal.

9. The device of claim 7, further including:
an adjustable oscillator for generating said another RF signal.

10. The device of claim 7, wherein;
said mixing means includes filters for lowpass and highpass filtering said signal obtained, and thereby weighting centre frequencies provided as said mixing result.

11. A device for adjusting an RF bandpass filter, comprising:
(a) first deriving means for deriving a first RF sample signal proportional to the power of a modulated RF signal which is reflected from the input of the bandpass filter;
(b) second deriving means for deriving a second RF sample signal proportional to the power of said modulated RF signal as passing forward to said bandpass filter;
(c) mixing means down-converting said first and second sample signals by a same other RF signal by:
(i) mixing each respective sample signal with said other RF signal having a substantially different frequency from each respective said sample signal, and said other RF signal being one of:
unmodulated, and
differing in modulation, such that each respective signal obtained is an AC signal of lower frequency, having a DC component; and
(ii) removing the DC component from each respective signal obtained, to provide a respective mixing result;
(d) detecting means for detecting the signal strength of each said mixing result;
(e) calculating means for calculating a reflection coefficient from the signal strengths detected; and
(f) control means for adjusting the centre frequency of said bandpass filter on the basis of said reflection coefficient.

12. A device for adjusting an RF bandpass filter, comprising:
(a) first deriving means for deriving a first RF sample signal proportional to the power of a modulated RF signal which is reflected from the input of the bandpass filter;
(b) second deriving means for deriving a second RF sample signal proportional to the power of said modulated RF signal as passing forward to said bandpass filter;
(c) third deriving means for deriving a third RF sample signal proportional to the power of said modulated RF signal as passed through said bandpass filter;
(d) mixing means for down-converting said first, second and third sample signals by a same other RF signal by:
(i) mixing each respective sample signal with said other RF signal having a substantially different frequency from each respective said sample signal, and said RF signal being one of:

unmodulated, and
differing in modulation, such that each respective signal obtained is an AC signal of lower frequency, having a DC component; and (ii) removing the DC component from each respective signal obtained, to provide respective first, second and third mixing results;

(e) detecting means for detecting the signal strength of each said mixing result;

(f) calculating means for calculating two power ratios, respectively of said first and second mixing results and said third and second mixing results; and (g) control means for adjusting the centre frequency of said bandpass filter so as to maintain said ratios within desired ranges of values.

* * * * *